United States Patent [19]

Lamoglia

[11] 4,248,274
[45] Feb. 3, 1981

[54] LEAD BENDING TOOL

[76] Inventor: Miguel R. Lamoglia, 323 W. 43rd St., Apt. 21, New York, N.Y. 10036

[21] Appl. No.: 25,847

[22] Filed: Apr. 2, 1979

[51] Int. Cl.³ .............................................. B21F 45/00
[52] U.S. Cl. ............................. 140/106; 72/DIG. 10
[58] Field of Search ...................... 140/71 R, 105, 106, 140/123, 102.5; 72/DIG. 10

[56] References Cited

U.S. PATENT DOCUMENTS

| 70,529 | 11/1867 | Collier | 140/147 |
|---|---|---|---|
| 3,142,484 | 7/1964 | Press | 140/106 |
| 3,212,368 | 10/1965 | Hutchinson et al. | 140/123 |
| 3,401,548 | 9/1968 | Ross et al. | 140/123 |
| 3,559,433 | 2/1971 | Brown et al. | 72/DIG. 10 |

*Primary Examiner*—Lowell A. Larson
*Attorney, Agent, or Firm*—Darby & Darby

[57] ABSTRACT

An adjustable lead bending tool for use in bending the leads of electronic components comprises a pair of opposed elongated bending arms, each of which is in the form of a right triangle when viewed in plan. The hypotenuses of the two triangles face each other so that the distance between the outer edges of the arms remains substantially constant over its full length. The two arms terminate in measuring tips adapted to engage a pair of lead holes of a printed circuit (for example). The upper edges of each arm includes a series of grooves in which electrical components may be placed so that the leads, when bent against the sides of the two arms, will conform exactly to the desired dimension. The tool may include special grooves for bending the leads of very small components, specially aligned holes for straightening the leads of solid state components, and a measuring scale to calibrate the distance between the two lead holes.

6 Claims, 7 Drawing Figures

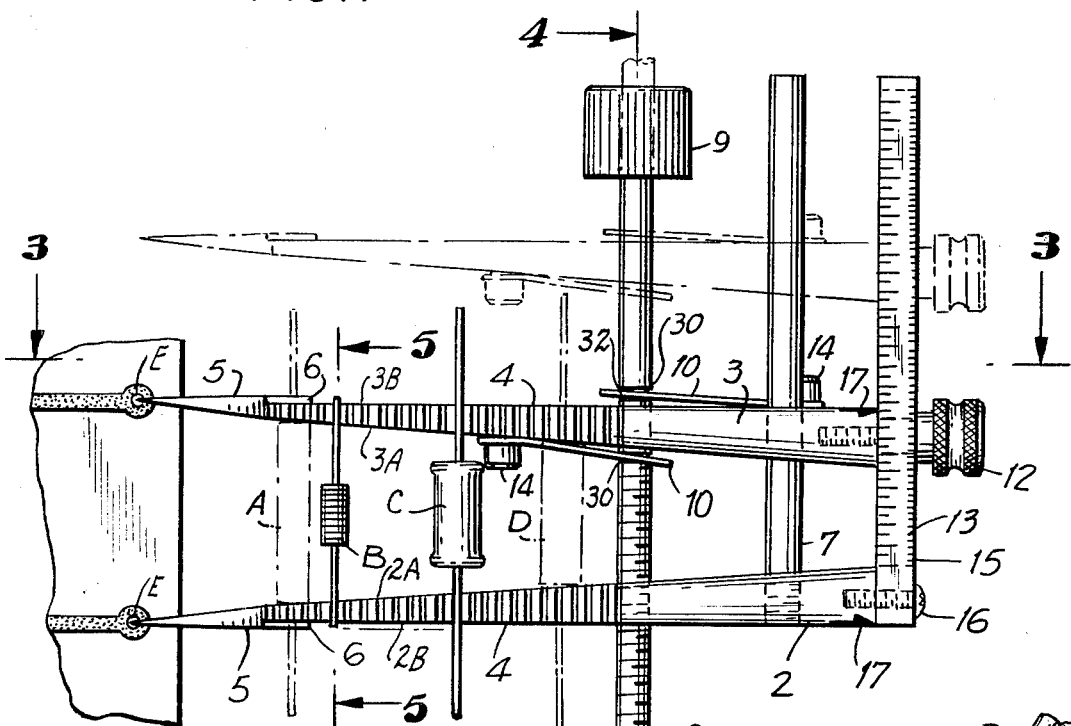
FIG.1
FIG.7
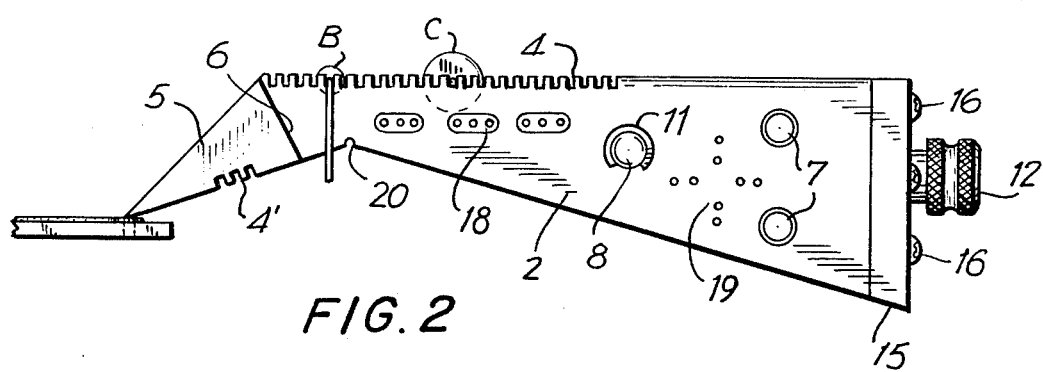
FIG.2

LEAD BENDING TOOL

This invention relates to a tool for use in bending the leads of electronic components which are to be attached to a printed circuit.

In connecting electronic components to a printed circuit, the leads of the components should be bent to conform to the spacing between the lead holes (or terminals) on the printed circuit to which the component is to be connected. Different types of tools or "bending blocks" have been proposed for this purpose. These tools reduce the likelihood of damage to the components from the use of pliers or the like, require less time, and in general result in a more uniform and better-looking finished product. Conventional bending blocks comprise a series of grooves in a pair of triangular shaped arms between which the component to be bent is placed. The component is placed between the arms in a selected one of the grooves and the leads force downwardly against the sides of the arms. The distance between the ends of the bent leads is determined by the selection of grooves.

The present invention provides a lead bending tool which is superior to known devices in that the device is continuously variable so that for any lead hole or terminal spacing, the device can be adjusted to bend the leads of a component to conform exactly to that spacing.

In accordance with the invention, the two arms of the device can be set for a selected spacing and, thereafter, used to bend the leads of a large number of different components, which may vary greatly in size, to that spacing.

SUMMARY OF THE INVENTION

In accordance with the invention, a lead bending device for electronic components comprises a pair of arms which form right triangles in plan view. The hypotenuses of the two arms face each other and the arms may be moved toward and away from each other to adjust the position between them. Each arm terminates in a measuring tip which is generally coincident with the outer straight edges of the triangular shaped arms so that when the tips have been placed in the lead holes of a printed circuit, the leads of any selected component can be bent to conform to those holes by placing the component in any of a series of grooves extending across the top of the two lead arms and forcing the leads downwardly against the sides of the arms.

THE DRAWINGS

FIG. 1 is a top plan view of a lead bending tool according to the invention;

FIG. 2 is a left side view of the tool;

FIG. 7 is a perspective view showing the forward portions of the two arms between which the components are placed so that the leads can be bent to a selected lead hole spacing.

DETAILED DESCRIPTION

In accordance with the invention, a lead bending tool includes a left bending arm 2 and a right bending arm 3 each of which in plan view (FIG. 1) is in the form of an elongated right triangle. The arms 2 and 3 may be made of plastic or metal, such as aluminum. The bending arms are arranged in an opposing relationship with the hypotenuses 2A and 3A of the triangles facing each other. This means that the elongated straight edges 2B and 3B of the "triangles" will face outwardly so that the distance between these two edges will remain constant at any position.

Figure 3:
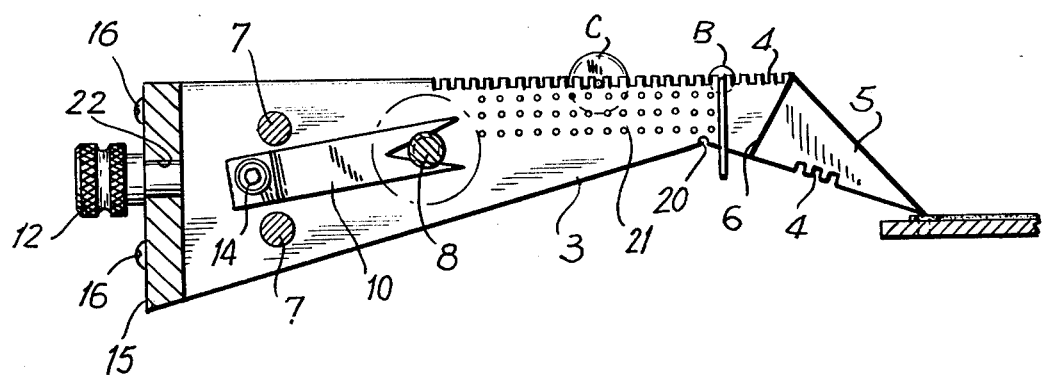
FIG. 3 is a sectional view along the line 3—3 of FIG. 1.

The shapes of the bending arms from the side is shown in FIGS. 2 and 3. Each bending arm includes a multiplicity of parallel grooves 4 in the upper surface of the arm. The leads of the electronic components to be bent to conform to a selected lead hole or terminal spacing rest in these grooves 4.

Obviously, the invention has utility with any type of electronic component such as resistors, capacitors, diodes, or anything else. For purposes of example only, resistors A and B and capacitors C and D are illustrated in FIG. 1. Resistor B is shown with its leads bent downwardly to conform to the spacing of a pair of lead holes E.

Each of the arms 2 and 3 terminates in a measuring tip 5, the configuration of which is best shown in FIGS. 2 and 3. The tips terminate in slanted edges 6 and also include lower grooves 4' which can be used to bend the leads of small components.

Figure 5:
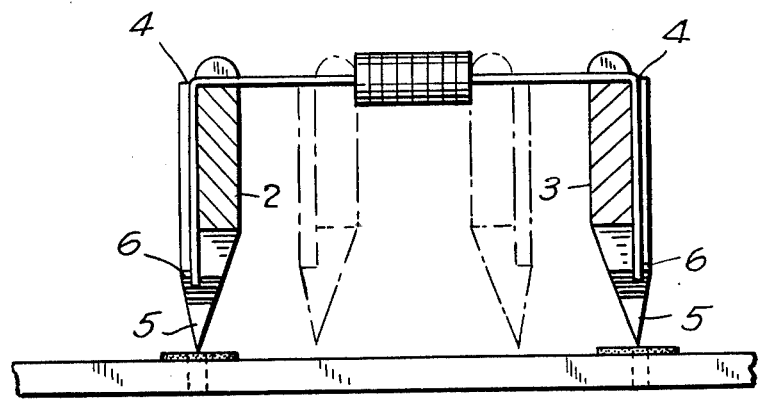
FIG. 5 is a sectional view along the line 5—5 of FIG. 1.

The measuring tips 5 are displaced slightly from the outer sides of the bending arms 2 and 3 so that when the tips 5 are placed on the lead holes E into which a component is to be placed, the leads when bent against the sides of the arms will conform exactly to the lead hole spacing. The tips 5 may be tapered slightly (FIG. 5) so that the offset relative to the long parallel edges 2B and 3B of arms 2 and 3 will vary slightly depending on the depth of insertion of tips 5 into holes E. This enables the accommodation of different diameter leads.

Figure 4:
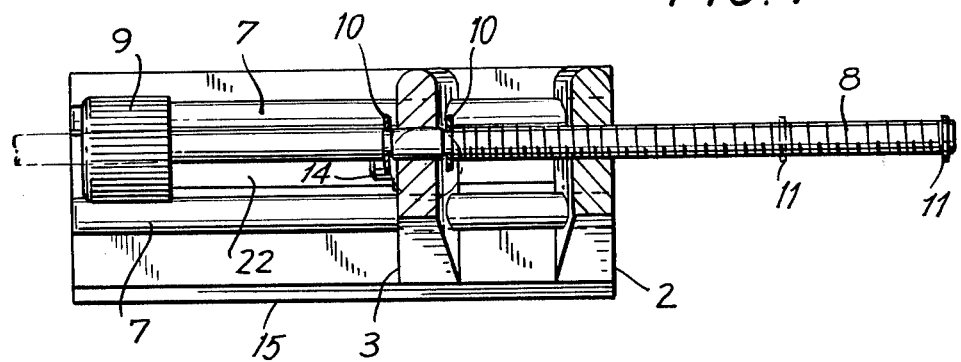
FIG. 4 is a sectional view along the line 4—4 of FIG. 1.

A pair of guide bars 7 (see FIGS. 3 and 4) are attached in any satisfactory way to the left bending arm 2. The guide rods 7 pass through apertures in the right bending arm 3 so that the arm 3 may be moved freely with respect thereto. Movement of the right bending arm 3 is provided by a lead screw 8 which is manually rotatable by knob 9 and which threadedly engages an aperture (not numbered) in arm 2. A pair of thread clips 10 attached to opposite sides of arm 3 by rivets 14 engage respective channels 30 on opposite sides of an unthreaded section 32 of the lead screw 8. Hence, as the lead screw 8 is rotated, the arm 3 is caused to move relative to arm 2. A C-ring 11 prevents disengagement of screw 8 and the threaded aperture in arm 2.

At the ends of the arms opposite the tips 5 a base plate 15 is provided with a scale 13 on its upper surface as shown in FIG. 1. A locking screw 12 passes through an elongated slot 22 (FIG. 3) within bar 15 and into a threaded engagement with the thick end of the right bending arm 3. The left bending arm 2 is attached to the bar 15 by means of screws 16 or the like.

In use, locking screw 12 is loosened and the knob 9 is turned until the tracing tips 5 engage the lead holes E to which an electronic component is to be connected. When the proper spacing is achieved, locking screw 12 is tightened. The components A, B, C or D may then be placed into the grooves 4 and the leads forced downwardly so that they will be bent to conform exactly to the lead hole spacing. Because of the shape of the arms 2 and 3, a component can be placed in any pair of grooves 4 and its leads bent to the desired spacing. Indicating means such as arrows 17 may be provided on arms 2 and 3 so that, in cooperation with the scale 15, they can provide an indication to the user of the spacing in inches or centimeters.

A convenient feature of the invention is in the provision of lead straightening holes especially adapted for use with particular types of components. Thus, the groups of holes 18 may be used to straighten the leads of transistors by inserting the leads into the hole and then pulling the leads through the holes. Holes 19 may also be used for transistors and other appropriately configured devices. The groove 20 may be used to straighten the leads of capacitors and resistors (or for lead bending purposes) and the holes 21 may be used to straighten the leads of various types of IC components.

Figure 6:
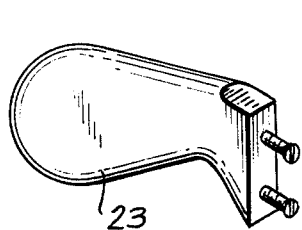
FIG. 6 is a perspective view of a handle which can be used with the invention.

If desired, a handle 23 as shown in FIG. 6 may be attached to the base 15 for ease in handling.

I claim:

1. A device for bending the leads of electronic components which may vary in length, comprising:
   a pair of opposed elongated bending arms, at least a portion of each of said arms having the shape of a right triangle in plan with the hypotenuses thereof facing each other, with the bending distance between the outer edges of each said portion being substantially constant over its length, the distance between said hypotenuses varying to accommodate electronic components of different lengths, and to ensure that the distances between the ends of the component and the bends in the lead are equal, and with each arm terminating in a measuring tip,
   a plurality of grooves perpendicular to said outer edges in the upper surfaces of said arms, whereby for a specified bending distance, each pair of grooves in the two arms provides a different length supporting surface for the leads of a component,
   means for moving said arms toward and away from each other, and
   means for fixing the position of said arms relative to each other.

2. A lead bending device according to claim 1, wherein each measuring tip is displaced approximately the width of an electrical lead from the outer edge of its associated arm.

3. A lead bending device according to claim 1, including a plurality of grooves beneath each of the tracing tips.

4. A lead bending device according to claim 1, including a base plate attached to at least one of the arms and wherein the top of the base plate includes a measuring scale to indicate the distance between the measuring tips of the two arms.

5. A lead bending device according to claim 1, wherein said means for moving said arms comprises a lead screw.

6. A lead bending device according to claim 1, wherein each of the arms includes a plurality of holes for straightening the leads of the electronic components.

* * * * *